United States Patent
Chen (10) Patent No.: US 11,373,885 B2
(45) Date of Patent: Jun. 28, 2022

(54) WET ETCHING APPARATUS

(71) Applicant: WUHAN CHINA STAR OPTOELECTRONICS SEMICONDUCTOR DISPLAY TECHNOLOGY CO., LTD., Hubei (CN)

(72) Inventor: Jianfeng Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 337 days.

(21) Appl. No.: 16/607,734

(22) PCT Filed: Jun. 3, 2019

(86) PCT No.: PCT/CN2019/089800
§ 371 (c)(1),
(2) Date: Oct. 24, 2019

(87) PCT Pub. No.: WO2020/228068
PCT Pub. Date: Nov. 19, 2020

(65) Prior Publication Data
US 2020/0365423 A1 Nov. 19, 2020

(30) Foreign Application Priority Data
May 16, 2019 (CN) .......................... 201910406084.1

(51) Int. Cl.
*H01L 21/67* (2006.01)

(52) U.S. Cl.
CPC ................ *H01L 21/6708* (2013.01)

(58) Field of Classification Search
None
See application file for complete search history.

(56) References Cited

U.S. PATENT DOCUMENTS

| 4,415,143 | A | * | 11/1983 | Ebata ................ B21B 45/0218 134/122 R |
| 5,007,968 | A | * | 4/1991 | Coffman ................ C23F 1/08 134/103.2 |
| 5,464,474 | A | * | 11/1995 | Nishimoto .............. B08B 1/007 118/104 |
| 5,553,633 | A | * | 9/1996 | Ciccarelli, Jr. ......... F26B 15/18 134/72 |

(Continued)

*Primary Examiner* — Sylvia MacArthur
(74) *Attorney, Agent, or Firm* — Mark M. Friedman (57) ABSTRACT

A wet etching apparatus is provided. The wet etching apparatus induces an etching chamber, at least one shutter, and at least one spraying pipe. The etching chamber is used for accommodating and etching a substrate, and has an inlet at its front end as well as an outlet at its rear end. The shutter is mounted at the inlet or the outlet by a shaft. The spraying pipe disposed on the shaft overturns with the shutter at the same time. It can effectively remove a large number of crystals of the etching liquid generated at the inlet of the etching chamber and the outlet of the etching chamber by spraying over the inlet of the etching chamber and the outlet of the etching chamber through the spraying pipe, thereby improving an utilization of the apparatus, cleanliness, and a product quality.

10 Claims, 4 Drawing Sheets

(56) References Cited

U.S. PATENT DOCUMENTS

| | | | | | |
|---|---|---|---|---|---|
| 5,862,820 | A | * | 1/1999 | Kageyama | B08B 3/022 |
| | | | | | 134/64 R |
| 6,270,620 | B1 | * | 8/2001 | Chih-Peng | C23F 1/08 |
| | | | | | 134/122 R |
| 6,271,149 | B1 | * | 8/2001 | Kondo | H01L 21/67028 |
| | | | | | 430/127 |
| 2004/0104199 | A1 | * | 6/2004 | Uesugi | H01L 21/6708 |
| | | | | | 216/83 |
| 2004/0241996 | A1 | * | 12/2004 | Hung | H01L 21/31138 |
| | | | | | 438/689 |
| 2006/0011222 | A1 | * | 1/2006 | Lee | H01L 21/67028 |
| | | | | | 134/61 |
| 2008/0057838 | A1 | * | 3/2008 | Huang | H01L 21/67051 |
| | | | | | 451/80 |
| 2017/0110344 | A1 | * | 4/2017 | Xue | H01L 21/6708 |
| 2017/0263471 | A1 | * | 9/2017 | Imai | H01L 21/67028 |
| 2017/0370016 | A1 | * | 12/2017 | Yamakawa | C25D 17/001 |
| 2018/0108549 | A1 | * | 4/2018 | Liu | H01J 37/32009 |
| 2020/0365423 | A1 | * | 11/2020 | Chen | H01L 21/6776 |

* cited by examiner

FIG. 8

WET ETCHING APPARATUS

FIELD OF INVENTION

The present invention relates to the field of microelectronic processing apparatus techniques. In particular, the present invention relates to a wet etching apparatus.

BACKGROUND OF INVENTION

In the field of display techniques, flat panel display devices, such as a liquid crystal displays (LCDs) and organic light emitting diodes (OLEDs), have gradually replaced cathode ray tube (CRT) displays.

The LCDs are formed by laminating a thin film transistor array substrate (TFT array substrate) and a color filter (CF) substrate, and liquid crystals are injected between the TFT substrate and the CF substrate, and liquid crystal molecules are controlled to change a direction by energizing or not, so as to refract light of a backlight module to generate an image. In a TFT-LCD manufacturing process, an indium tin oxide (ITO) is widely used to produce a transparent display electrode due to its excellent property. In a manufacturing process of the ITO transparent display electrode, an ITO thin film is firstly formed by magnetron sputtering, and then a photoresist pattern is formed by photolithography, and finally the ITO thin film is patterned by wet etching to form the final transparent display electrode.

Figure 1:
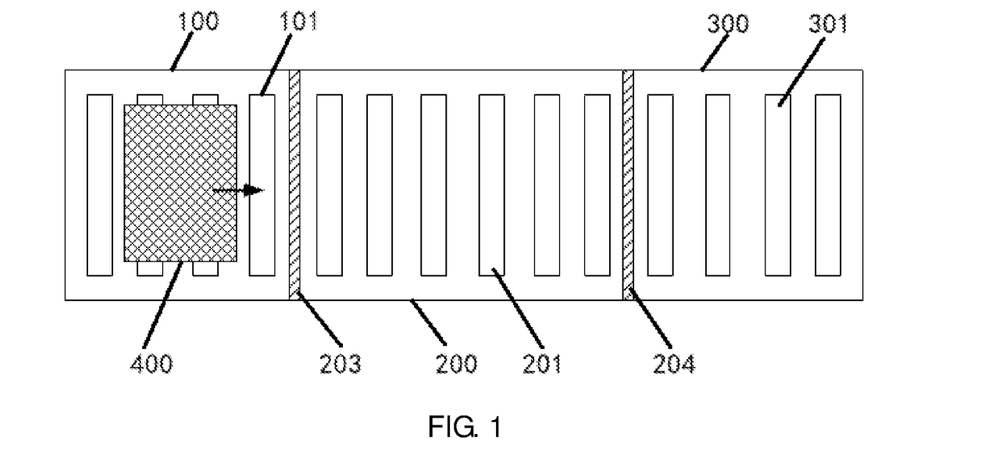
FIG. 1 is a top view of a wet etching apparatus manufactured by the prior art.
Figure 2:
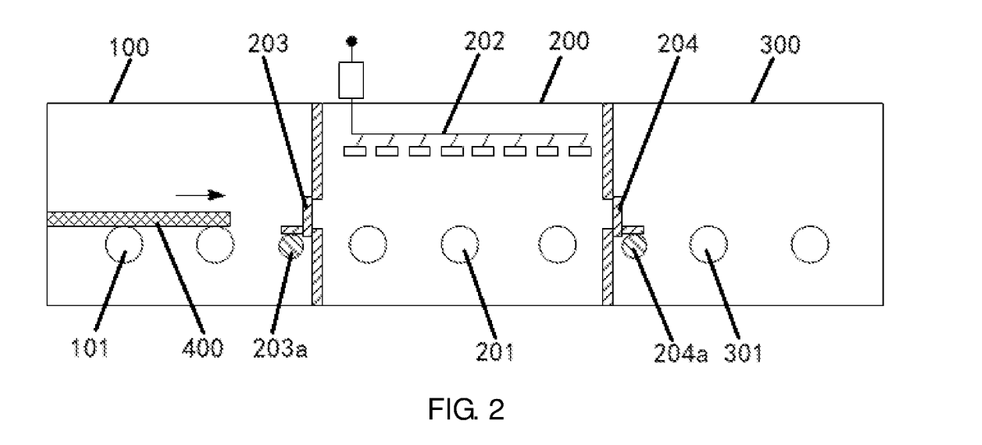
FIG. 2 is a schematic view of an internal structure of the wet etching apparatus manufactured by the prior art.

As shown in FIG. 1 and FIG. 2, it is a schematic structural view of a wet etching apparatus for patterning the ITO thin film in prior art. The wet etching apparatus includes an etching chamber 200, and there is one of cushion chambers at the front and the rear of the etching chamber 200, respectively, i.e., a front cushion chamber 100 and a rear cushion chamber 300. Transporting wheels (101, 201, 301, etc.) transport the substrate 400 from the front cushion chamber 100 to the etching chamber 200 to perform the etching, and then the etched substrate is transported from the etching chamber 200 to the rear cushion chamber 300. A front shutter 203 is mounted at an inlet of the front cushion chamber 100 near the etching chamber 200. A shaft 203a is mounted at a lower portion of the front shutter 203. The shaft 203a connected to a cylinder can drive the front shutter to perform the up/down overturning to complete an opening/closing action by the up/down actuation of the cylinder. Before the substrate 400 entering the etching chamber 200 from the front cushion chamber 100, the front shutter 203 is opened. After the substrate 400 completely entering the etching chamber 200, the front shutter 203 is closed. Similarly, a rear shutter 204 is mounted at an outlet of the rear cushion chamber 300 near the etching chamber 200. The rear shutter 204 has the same structure and action mode as the front shutter 203, and a shaft 204a is also mounted at a lower portion of the rear shutter 204. Before the substrate 400 entering the rear cushion chamber 300, the rear shutter 204 is opened. After the substrate 400 completely entering the rear cushion chamber 300, the rear shutter 204 is closed.

As can be seen, in addition to the time of the substrate entering and exiting, the etching chamber remains relatively closed, thereby creating a stable etching environment for the etching of the substrate 400. The etching of the substrate 400 is generally in a spraying mode, that is, a spraying device 202 ejects an etching liquid toward the lower substrate 400, thereby removing the ITO thin film which is not covered by the photoresist pattern. Oxalic acid (also called ethanedioic acid) is widely used for the ITO wet etching, because it has low cost and fully meets requirements of the entire process of the TFT substrate. In the process of the TFT substrate, the oxalic acid used for the ITO wet etching is generally an aqueous solution with a concentration of 3.4% to 3.8%, and a process temperature is between 40° C. and 45° C. However, a characteristic of the oxalic acid is that white crystals are easily formed after cooling.

In the process of the ITO wet etching, the front shutter 203 and the rear shutter 204 are continuously opened and closed, and the oxalic acid within the etching chamber 200 volatilizes from the shutter in an opened state. Because a temperature of the etching chamber is lower than temperatures of the front and the rear cushion chamber, the oxalic acid crystallizes in cold, and a large number of crystals are formed at the inlet, the outlet and the shutter of the etching chamber. Over time, they can cover the entire inlet and the entire outlet of the etching chamber. If they are not cleaned in time, they will cause the contamination of an internal environment of a machine, and even cause scratches on the substrate, especially the scratches on a photoresist layer, and thereby seriously affect a product quality. However, a frequent cleaning will occupy a lot of up time of the apparatus and reduce an utilization of the apparatus.

Furthermore, the above crystallization problems also exist in other etching liquids which are easy to generate the crystals (for example, the etching liquid for aluminium (AL), molybdenum (MO), argentum (Ag), oxides (such as ITO, indium gallium zinc oxide (IGZO), etc.) etching with nitric acid ($HNO_3$), acetic acid ($CH_3COOH$) or phosphoric acid ($H_3PO_4$) as a main component; the copper (Cu) etching liquid with hydrogen peroxide ($H_2O_2$) as a main component, etc.) and used for the wet etching of semiconductor related industries. Therefore, how to solve the problems of generating a large amount of crystals during the wet etching using the etching liquid which easily generates the crystals has become a major problem in the wet etching process of the semiconductor related industries.

Technical Problem

Given the above technical problems, the present invention provides a wet etching apparatus to remove the crystals of the etching liquid at the inlet and the outlet of the etching chamber, thereby elevating a production efficiency and the product quality.

SUMMARY OF INVENTION

In order to solve the above problems, the present invention provides a wet etching apparatus with a function of remove crystals of an etching liquid outside an etching chamber, and the apparatus includes the etching chamber, at least one shutter and at least one spraying pipe. Specifically, the etching chamber accommodates and etches a substrate, and has the inlet at a front end thereof as well as the outlet at a rear end thereof. The shutter is a folding type shutter, and is mounted at the inlet or the outlet by a shaft, and is perpendicular to a passing direction of the substrate. When the substrate passes, the shutter can be opened, and when the substrate doesn't need to pass, the shutter can be closed. The spraying pipe is disposed on the shaft. When the shutter is opened, the spraying pipe rotates together with the shutter, and leaves the inlet and the outlet. And the spraying pipe is located below a passing channel of the substrate. When the shutter is closed, the spraying pipe returns to an initial position together with the shutter which closes the inlet and the outlet. And the spraying pipe is located above the passing channel of the substrate. The spraying pipe is able to eject a liquid toward periphery to clean the crystals of the etching liquid formed at the inlet or the outlet.

Furthermore, the shutter includes a shielding baffle, a mounting board and a scraper. Specifically, the shielding baffle has a first surface and a second surface parallel to each other. The mounting board is perpendicularly disposed at the first surface of the shielding baffle, and fixedly connected to the shaft. The scraper is perpendicularly disposed at the second surface of the shielding baffle, and scraps the crystals of the etching liquid formed at the inlet or the outlet during the shutter being closed.

Furthermore, the spraying pipe includes a spraying pipe main body and a plurality of sets of fine holes distributed on the spraying pipe main body.

Furthermore, the wet etching apparatus further includes at least one cushion chamber connected to the front end or the rear end of the etching chamber. The cushion chamber communicates with the etching chamber by the shutter, and accommodates the shaft as well as the shutter and the spraying pipe both disposed on the shaft.

Furthermore, the spraying pipe includes two cushion chambers, two of the shutters and two of the spraying pipes. Specifically, two cushion chambers include a front cushion chamber and a rear cushion chamber, wherein the front cushion chamber is disposed at the front end of the etching chamber, and the rear cushion chamber is disposed at the rear end of the etching chamber. Two of the shutters include a front shutter and a rear shutter. The front shutter is mounted at the inlet of the etching chamber by a shaft, and the rear shutter is mounted at the outlet of the etching chamber by another shaft. Two of the spraying pipes are respectively located in the front cushion chamber and the rear cushion chamber.

Furthermore, the rear cushion chamber further includes at least one air knife unit which is obliquely disposed in the passing direction of the substrate.

Moreover, the air knife unit is able to eject a compressed gas or liquid to the substrate.

Moreover, the air knife unit includes a non-return valve for controlling to prevent the liquid from backflow when the air knife unit ejects the gas.

Moreover, the wet etching apparatus further includes a water tank disposed below the spraying pipe.

Also, the water tank also includes a liquid inlet and a liquid outlet. Specifically, the liquid inlet is disposed at a bottom surface of the water tank. The liquid outlet is disposed at the bottom surface of the water tank, and a horizontal plane of the liquid outlet is higher than the bottom surface.

Advantageous Effects

An advantage effect of the present invention is to provide a wet etching apparatus which can effectively remove a large number of the crystals of the etching liquid generated at the inlet of the etching chamber and the outlet of the etching chamber by spraying over the inlet of the etching chamber and the outlet of the etching chamber, thereby improving an utilization of the apparatus, cleanliness and a product quality.

1 etching chamber, 2 shutter, 3 spraying pipe, 4 shaft, 5 cushion chamber, 6 transporting wheel, 7 air knife unit, 8 water tank, 10 etching apparatus, 11 spraying device, 20 substrate, 21 front shutter, 22 rear shutter, 30 crystal of etching liquid, 31 spraying pipe main body, 32 fine hole, 51 front cushion chamber, 52 rear cushion chamber, 81 liquid inlet, 82 liquid outlet, 83 reservoir, 210 shielding baffle, 230 scraper, 501 exhaust vent, 811 valve, 812 water pump

DETAILED DESCRIPTION OF PREFERRED EMBODIMENTS

In the description of the present invention, it is appreciated that the indicative orientation or the positional relationship of the terms "center", "longitudinal", "transverse", "length", "width", "thickness", "upper", "lower", "front", "back", "left", "right", "vertical", "horizontal", "top", "bottom", "inside", "outside", "clockwise", "counterclockwise" and the like is based on the orientation or the positional relationship shown in the drawings, and is merely for convenience of the description of the present invention and a simplified description, and is not intended to indicate or imply that the device or the element necessarily has a particular orientation as well as structure and operation in a particular orientation, so it is not to be construed as limitations of the invention. Furthermore, the terms "first" and "second" are only used to describe the purposes and are not to be construed as indicating or implying a relative importance or implicitly indicating a number of indicated technical features. Therefore, the features defining "first" or "second" may include one or more of the described features either explicitly or implicitly. In the description of the present invention, the meaning of "a plurality of" is two or more unless there is an exactly and specifically definition otherwise.

The embodiments of the present invention utilize a characteristic that oxalic acid crystals are dissolved in water, and a spraying pipe is added on a shaft of an inverting shutter at an inlet and an outlet of an etching chamber, so that a large number of the crystals of an etching liquid generated at the inlet of the shutter, the outlet of the shutter and the shutter can be effectively removed. In order to make purposes, technical solutions and advantages of the present invention clearer, the present invention will be further described in detail below in combination with the specific embodiments and with reference to the accompanying drawings.

Figure 3:
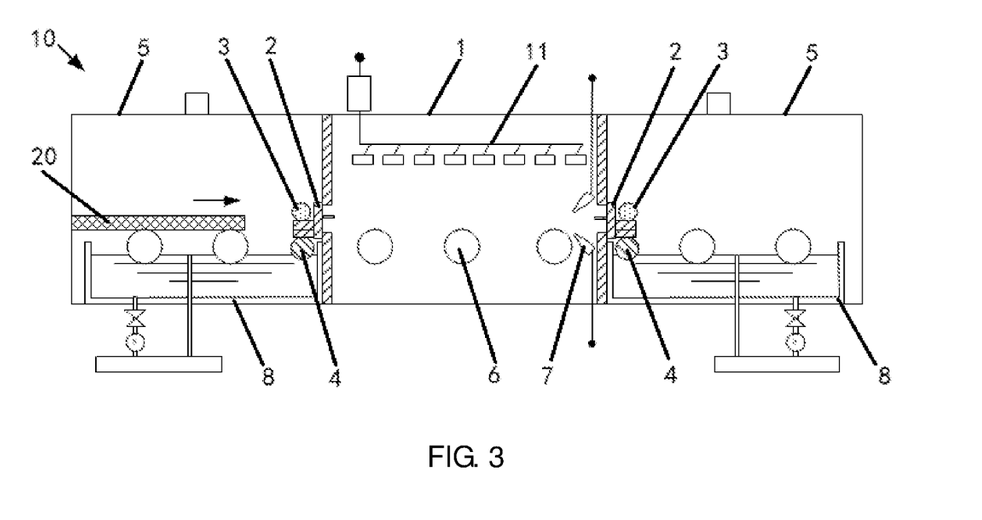
FIG. 3 is a schematically structural view of a wet etching apparatus as described in the present invention.
Figure 4:
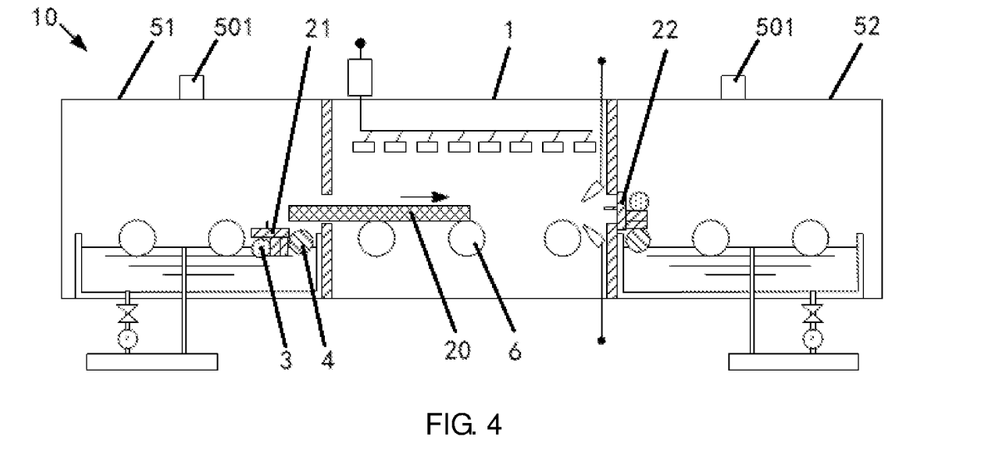
FIG. 4 is a schematically structural view of a substrate passing through a front shutter as described in the present invention.
Figure 5:
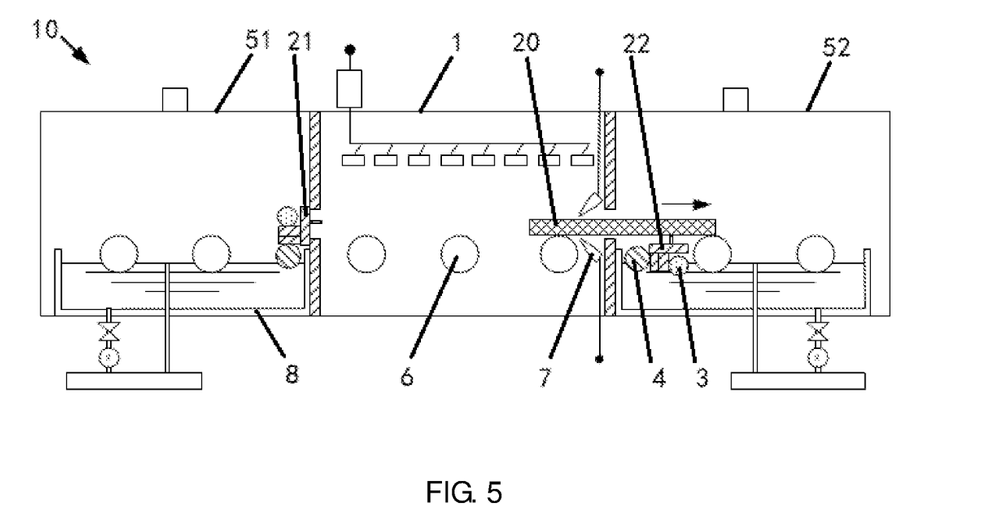
FIG. 5 is a schematically structural view of the substrate passing through a rear shutter as described in the present invention.

As shown in FIG. 3 to FIG. 5, the present invention provides a wet etching apparatus 10 with a function of removing the crystals of the etching liquid outside the etching chamber, and the apparatus includes the etching chamber 1, at least one shutter 2 and at least one spraying pipe 3.

Specifically, the etching chamber 1, accommodating and etching a substrate 20, is a main unit of the wet etching apparatus 10. In the etching chamber 1, a spraying device 11 ejects a predetermined concentration of the etching liquid to the lower substrate 20, and the preferred etching liquid in the embodiment is an oxalic acid solution for removing an ITO thin film on the substrate 20 which is not covered by the photoresist.

The etching chamber 1 has the inlet at a front end and the outlet at a rear end. The shutter 2 is a folding type shutter 2, and is mounted at the inlet or the outlet of the etching chamber 1 by the shaft 4. The shutter 2 is perpendicular to a passing direction of the substrate 20, and the shutter 2 can be opened when the substrate 20 passes, and the shutter 2 can be closed at other times.

In the embodiment, the wet etching apparatus 10 also includes at least one cushion chamber 5 connected to the front end and the rear end of the etching chamber 1. The cushion chamber 5 communicates with the etching chamber 1 by the shutter 2. And the cushion chamber 5 accommodates the shaft 4 as well as the shutter 2 and the spraying pipe 3 both disposed on the shaft 4.

The spraying pipe 3 is disposed on the shaft 4. When the shutter 2 is opened, the spraying pipe 3 rotates together with the shutter 2, and leaves the inlet and the outlet. And the spraying pipe 3 is located below a passing channel of the substrate 20. When the shutter 2 is closed, the spraying pipe 3 returns to an initial position together with the shutter 2 which closes the inlet and the outlet. And the spraying pipe 3 is located above the passing channel of the substrate 20. The spraying pipe 3 is able to eject a liquid toward periphery to clean the crystals of the etching liquid formed at the inlet or the outlet. More specifically, the shutter 2 is connected to the shaft 4, and the spraying pipe 3 can be disposed on the shutter 2 to carry out the indirect disposition of the spraying pipe 3 on the shaft 4.

Wherein the liquid ejected by the spraying pipe 3 is a pure water, and the pure water of the present invention includes a deionized water (DIW) or an alkaline solution.

In use, a plurality of successive transporting wheels 6 are mounted on the passing channel (also called the transporting path) of the substrate 20. By the push of the transporting wheels 6, the substrate 20 enters the etching chamber 1 from the cushion chamber 5 through the inlet of the etching chamber 1 to perform the etching, or is transferred to the cushion chamber 5 from the etching chamber 1 through the outlet.

Of course, one of the cushion chambers 5 may also be disposed at the front end and the rear end of the etching chamber 1, respectively. For example, in the embodiment, as shown in FIG. 4, the wet etching apparatus 10 includes two cushion chambers, i.e., a front cushion chamber 51 and a rear cushion chamber 52. Wherein the front cushion chamber 51 is disposed at the front end of the etching chamber 1, and the rear cushion chamber 52 is disposed at the rear end of the etching chamber 1.

Corresponding to the front cushion chamber 51 and the rear cushion chamber 52, the inlet and the outlet of the etching chamber 1 are respectively provided with one of the shutters. For example, in the embodiment, as shown in FIG. 4, the wet etching apparatus 10 includes two shutters, i.e., a front shutter 21 and a rear shutter 22. The front shutter 21 is mounted at the inlet of the etching chamber 1, and the rear shutter 22 is mounted at the outlet of the etching chamber 1.

In the embodiment, the wet etching apparatus 10 includes two spraying pipes 3 in the front cushion chamber 51 and the rear cushion chamber 52, respectively.

In more detail, referring to FIG. 4, the front shutter 21 is mounted at the front cushion chamber 51 near the inlet of the etching chamber 1. Wherein the shaft 4 is mounted at the lower portion of the inlet of the etching chamber 1, and the front shutter 21 is mounted on the shaft 4, so as to enable to open or close the inlet. Before the substrate 20 enters the etching chamber 1, the front shutter 21 is folded downward with 90 degrees toward a side of the front cushion chamber 51 so as to open the inlet of the etching chamber 1. The substrate 20 enters the etching chamber 1 through the inlet. After the substrate 20 completely enters the etching chamber 1, the front shutter 21 is folded upward with 90 degrees toward a side of the etching chamber 1 so as to close the inlet of the etching chamber 1, thereby ensuring a relatively closed environment in the etching chamber 1.

referring to FIG. 5, similarly, the rear shutter 22 is mounted at the rear cushion chamber 52 near the outlet of the etching chamber 1. Another shaft 4 is mounted at the lower portion of the outlet, and the rear shutter 22 is mounted on the shaft 4, so as to enable to open or close the outlet. Before the substrate 20 enters the rear cushion chamber 52, the rear shutter 22 is folded with 90 degrees toward a side of the rear cushion chamber 52 so as to open the outlet. The substrate 20 enters the rear cushion chamber 52 through the outlet. After the substrate 20 completely enters the rear cushion chamber 52, the rear shutter 22 is folded with 90 degrees toward a side of the etching chamber 1 so as to close the outlet of the etching chamber 1, thereby ensuring the relatively closed environment in the etching chamber 1.

In other words, in a closed state of the shutter 2, the shutter 2 is perpendicular to the passing direction of the substrate 20, and the inlet or the outlet of the etching chamber 1 is closed. In an opened state of the shutter 2, the shutter 2 is folded with 90 degrees toward a direction away from the etching chamber 1, and the inlet or the outlet of the etching chamber 1 is opened.

Figure 6:
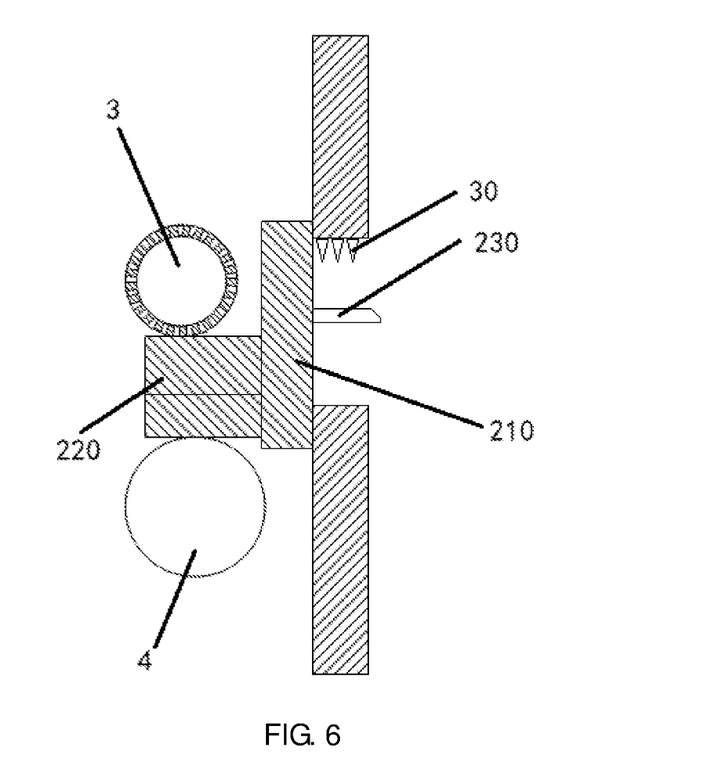
FIG. 6 is a partially enlarged view of FIG. 3, mainly showing a structure of the shutter.

Referring to FIG. 6, in the embodiment, the shutter 2 includes a shielding baffle 210, a mounting board 220 and a scraper 230. Specifically, the shielding baffle 210 has a first surface and a second surface parallel to each other. In the closed state of the shutter 2, the second surface is toward etching chamber 1. The mounting board 220 is perpendicularly disposed at the first surface of the shielding baffle 210, and fixedly connected to the shaft 4. The scraper 230 is perpendicularly disposed at the second surface of the shielding baffle 210, and scraps the crystals 30 of the etching liquid formed at the inlet or the outlet of the etching chamber 1 during the shutter 2 being closed.

In order to facilitate the rotation, the scraper 230 has a trapezoidal, triangular or curved tip at an end away from the second surface, such that a trajectory of the scraper 230 doesn't touch the inlet of the etching chamber 1 or the outlet of the etching chamber 1 and can be tangential thereto, so as to remove the crystals 30 of the etching liquid formed at the shutter 2 by the scraper 230 during the shutter being closed 2.

Figure 7:
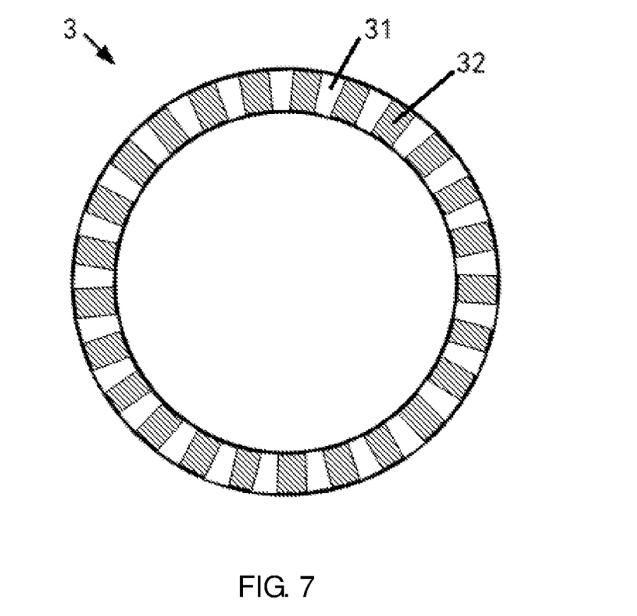
FIG. 7 is a schematically structural view of a spraying pipe as described in the present invention.

Referring to FIG. 7, in the embodiment, the spraying pipe 3 includes a spraying main body 31 and a plurality of sets of fine holes 32 distributed on the spraying pipe main body 31. A hole diameter of the fine holes 32 is between 2 mm and 5 mm.

In use, the spraying pipe 3 always ejects the liquid outward; or the spraying pipe 3 stops ejecting the liquid when the shutter 2 is in the opened state, and the spraying pipe 3 stops ejecting the liquid when the shutter 2 is in the closed state.

Referring to FIG. 4 and FIG. 5, in order to further improve the effect of removing the etching liquid or the crystals of the etching liquid on the substrate 20, in the embodiment, the cushion chamber 5 located at the inlet or the outlet of the etching chamber 1 also includes an exhaust vent 501 for exhausting a gas generated by the etching process. The cushion chamber 5 located at the outlet of the etching chamber 1 (i.e., the rare cushion chamber) also includes at least one air knife unit 7 which is obliquely disposed in the passing direction of the substrate 20. Specifically, one of the air knife units 7 may be disposed above and below the passing direction of the substrate 20 to remove the etching liquid or the crystals of the etching liquid on the substrate 20.

In the embodiment, the air knife unit 7 has a knife shape, and its tip is used to eject a compressed gas or liquid toward the substrate 20. The air knife unit 7 can alternately eject the compressed gas and the liquid, and the ejected liquid is the pure water or the alkaline solution.

In the embodiment, the air knife unit 7 includes a non-return valve (not shown) for controlling to prevent the liquid from backflow when the air knife unit 7 ejects the gas. When the air knife unit 7 alternately ejects the compressed gas and the liquid, the non-return valve can prevent the compressed gas from entering a liquid delivery duct, thereby preventing the liquid from backflow.

Figure 8:
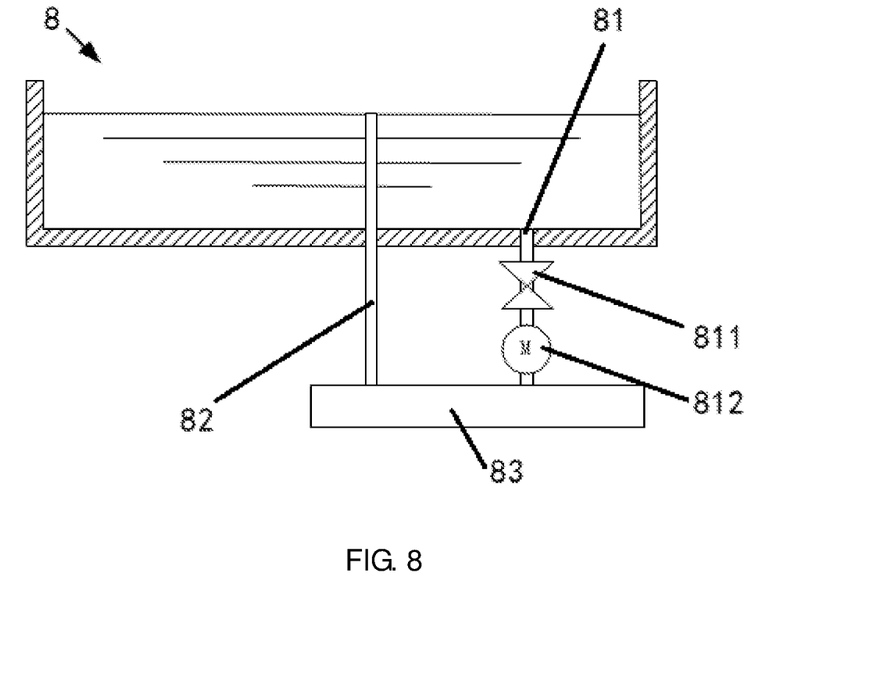
FIG. 8 is a schematically structural view of a water tank as described in the present invention.

Referring to FIG. 8, in the embodiment, the wet etching apparatus 10 also includes a water tank 8 disposed below the spraying pipe 3. The water tank 8 is used to recycle the liquid ejected by the spraying pipe 3 and to drain the liquid, and has a cooling function which can lower a temperature to improve the effect of removing the etching liquid or the crystals of the etching liquid on the substrate 20.

In the embodiment, the water tank 8 includes a liquid inlet 81 and a liquid outlet 82. Specifically, the liquid inlet 81 is disposed at a bottom surface of the water tank 8. The liquid outlet 82 is disposed at the bottom surface of the water tank 8, and a horizontal plane of the liquid outlet 82 is higher than the bottom surface. It can ensure that there is a liquid in the water tank 8 for cooling. The liquid inlet 81 is injected with the pure water through a valve 811 and a water pump 812, and the liquid flows out when a liquid level is higher than the horizontal plane of the liquid outlet 82, thus circulating by this way. Furthermore, the liquid in the water tank 8 can be recycled. Specifically, the liquid inlet 81 is connected to the liquid outlet 82 by a reservoir 83, and the purpose of recycling can be achieved by adjusting the composition in the reservoir 83, so as to save water resources and reduce production costs.

It should be noted that, in the embodiment, the ITO thin film is preferably etched by using the oxalic acid etching solution as an example, but the invention is not limited thereto. The etching liquid can also be other etching liquid easily generated the crystals, for example, the etching liquid for AL, MO, Ag, oxides (such as ITO, IGZO, etc.) etching with $HNO_3$, $CH_3COOH$ or $H_3PO_4$ as a main component, Cu etching liquid with $H_2O_2$ as a main component, etc. In this case, the crystals of the etching liquid can be cleaned by the pure water, and other liquids can also be used or enhancing ingredients with corresponding effects, such as sodium hydroxide (NaOH), potassium hydroxide (KOH), etc., can be added in the pure water. It depends on the etching solution specifically used in the wet etching apparatus 10.

In summary, by adding the spraying pipe 3 at the inlet and the outlet of the etching chamber 1, the present invention can effectively remove a large number of the crystals of the etching liquid generated at the inlet and the outlet of the etching chamber at a low cost, thereby improving an utilization of the apparatus, cleanliness and a product quality, and having a higher promotion and application value.

An advantage effect of the present invention is to provide a wet etching apparatus which can effectively remove a large number of the crystals of the etching liquid generated at the inlet of the etching chamber and the outlet of the etching chamber by spraying over the inlet of the etching chamber and the outlet of the etching chamber, thereby improving the utilization of the apparatus, cleanliness and the product quality.

The above description is only preferred embodiments of the present invention. It should be noted that a number of modifications and refinements may be made by those skilled in the art without departing from the principles of the invention, and such modifications and refinements are also considered to be within the scope of the invention.

What is claimed is:

1. A wet etching apparatus, comprising:
   an etching chamber accommodating and etching a substrate, and having an inlet at a front end thereof and an outlet at a rear end thereof;
   at least one shutter, being a folding type shutter, mounted at the inlet or the outlet by a shaft, and perpendicular to a passing direction of the substrate, wherein the shutter can be opened when the substrate passes, and the shutter can be closed when the substrate does not need to pass; and
   at least one spraying pipe directly disposed on the shutter and being rotatable along an axis of the shaft, wherein rotation of the shaft causes rotation of the shutter, wherein the shutter, in an open state, allows for the spraying pipe to be below a passing channel of the substrate, and
   wherein the shutter, in a closed state, allows for the spraying pipe to be above the passing channel of the substrate when the spraying pipe and the shutter rotate upward along the shaft together to return to initial positions; wherein the spraying pipe is configured to eject a liquid toward a periphery to clean crystals of an etching liquid formed at the inlet or the outlet.

2. The wet etching apparatus according to claim 1, wherein the shutter includes:
   a shielding baffle having a first surface and a second surface parallel to each other;
   a mounting board perpendicularly disposed at the first surface of the shielding baffle, and fixedly connected to the shaft; and
   a scraper perpendicularly disposed at the second surface of the shielding baffle, and scraping the crystals of the etching liquid formed at the inlet or the outlet during the shutter being closed.

3. The wet etching apparatus according to claim 1, wherein the spraying pipe includes:
   a spraying pipe main body; and
   a plurality of sets of fine holes distributed on the spraying pipe main body.

4. The wet etching apparatus according to claim 1, further comprising:
   at least one cushion chamber connected to the front end or the rear end of the etching chamber, wherein the cushion chamber communicates with the etching chamber by the shutter, and accommodates the shaft as well as the shutter and the spraying pipe both disposed on the shaft.

5. The wet etching apparatus according to claim 1, comprising:

two cushion chambers including a front cushion chamber and a rear cushion chamber, wherein the front cushion chamber is disposed at the front end of the etching chamber, and the rear cushion chamber is disposed at the rear end of the etching chamber;

two of the shutters including a front shutter and a rear shutter, wherein the front shutter is mounted at the inlet of the etching chamber by a shaft, and the rear shutter is mounted at the outlet of the etching chamber by another shaft; and two of the spraying pipes respectively located in the front cushion chamber and the rear cushion chamber.

6. The wet etching apparatus according to claim 5, wherein the rear cushion chamber further includes at least one air knife which is obliquely disposed in the passing direction of the substrate.

7. The wet etching apparatus according to claim 6, wherein the air knife is able to eject a compressed gas or liquid to the substrate.

8. The wet etching apparatus according to claim 6, wherein the air knife includes a non-return valve for controlling to prevent the liquid from backflow when the air knife ejects the gas.

9. The wet etching apparatus according to claim 1, further comprising:

a water tank disposed below the spraying pipe.

10. The wet etching apparatus according to claim 9, wherein the water tank also includes:

a liquid inlet disposed at a bottom surface of the water tank; and a liquid outlet disposed at the bottom surface of the water tank, wherein a horizontal plane of the liquid outlet is higher than the bottom surface.

* * * * *